US007468784B2

(12) United States Patent
Olsson (10) Patent No.: US 7,468,784 B2
(45) Date of Patent: Dec. 23, 2008

(54) METHOD AND DEVICE FOR FORMING OPTICAL OR MAGNETIC MEMORY MEDIA OR A TEMPLATE FOR THE SAME

(75) Inventor: Lennart Olsson, Malmö (SE)

(73) Assignee: Obducat AB, Malmo (SE)

( * ) Notice: Subject to any disclaimer, the term of this patent is extended or adjusted under 35 U.S.C. 154(b) by 190 days.

(21) Appl. No.: 10/512,274

(22) PCT Filed: Apr. 24, 2003

(86) PCT No.: PCT/SE03/00654

§ 371 (c)(1),
(2), (4) Date: Oct. 22, 2004

(87) PCT Pub. No.: WO03/091805

PCT Pub. Date: Nov. 6, 2003

(65) Prior Publication Data

US 2005/0174556 A1      Aug. 11, 2005

Related U.S. Application Data

(60) Provisional application No. 60/375,047, filed on Apr. 25, 2002.

(30) Foreign Application Priority Data

Apr. 24, 2002 (SE) .................................. 0201242

(51) Int. Cl.
*G03B 27/32* (2006.01)
*G03B 27/58* (2006.01)
*G11B 7/24* (2006.01)

(52) U.S. Cl. .................. 355/77; 355/72; 369/275.4
(58) Field of Classification Search .................. 355/77, 355/72, 67; 369/275.4, 47.49; 264/1.33; 430/320, 321; 360/236.1; 250/492.23
See application file for complete search history.

(56) References Cited

U.S. PATENT DOCUMENTS 5,040,165 A * 8/1991 Taii et al. .................. 369/275.4

(Continued)

FOREIGN PATENT DOCUMENTS

EP   0448735 A1   10/1991

(Continued)

OTHER PUBLICATIONS

"First Examination Report" from the Indian Patent Office, dated Dec. 14, 2006, in corresponding application No. 3043/DELNP/2004 (2 pages).

(Continued)

*Primary Examiner*—Peter B Kim
(74) *Attorney, Agent, or Firm*—Finnegan, Henderson, Farabow, Garrett & Dunner, L.L.P.

(57) ABSTRACT

A method and device for forming an optical or magnetic memory medium or a template for making such memory media, including suspending an essentially flat substrate rotatably about an axis, arranging a particle beam source to expose the surface layer to a particle beam, rotating the substrate such that the particle beam forms a groove in the surface layer by exposure to a predetermined degree, which groove has a width on the order of 1-100 nm, and controlling the position of the particle beam and the axis relative to each other, during rotation of the substrate about the axis so that part of the groove is subjected to more than one exposure to the particle beam, whereby the groove is formed as a sum of said more than one exposure, which sum corresponds to said predetermined degree of exposure.

14 Claims, 5 Drawing Sheets

U.S. PATENT DOCUMENTS

| | | |
|---|---|---|
| 5,045,438 A | 9/1991 | Adachi |
| 5,854,671 A | 12/1998 | Nishi |
| 5,981,962 A | 11/1999 | Groves et al. |
| 6,887,652 B2 * | 5/2005 | Hino et al. .................. 430/321 |
| 2001/0012696 A1 | 8/2001 | Minakuti et al. |
| 2001/0053113 A1 * | 12/2001 | Katsumura ............... 369/47.49 |
| 2003/0137065 A1 * | 7/2003 | Medower et al. ........... 264/1.33 |

FOREIGN PATENT DOCUMENTS

| | | |
|---|---|---|
| EP | 1 043 625 A1 | 10/2000 |

OTHER PUBLICATIONS

European Patent Office communication, dated Mar. 22, 2007, in Application 03 721 234.7 (4 pages).

* cited by examiner

METHOD AND DEVICE FOR FORMING OPTICAL OR MAGNETIC MEMORY MEDIA OR A TEMPLATE FOR THE SAME

CROSS REFERENCE TO RELATED APPLICATIONS

This application is an national phase application based on PCT/SE03/00654, filed Apr. 24, 2003, which claims the right to priority based on Swedish Application No. 0201242-5, filed Apr. 24, 2002; and claims the benefit of U.S. Provisional Application No. 60/375,047, filed Apr. 25, 2002, the content of all of which is incorporated herein by reference.

FIELD OF THE INVENTION

The present invention relates to a method, a device and a computer program product for forming, by exposure to a lithographic beam, a groove of a material, exposed to a predetermined degree, in a surface layer of an essentially flat, rotatable substrate.

BACKGROUND ART

When manufacturing rotatable memory media, such as optical, magnetic, magnetooptical or holographic memory media, there is a need for making a groove in a surface with great accuracy. The grooves may have a width in the order of 1-100 nanometers.

A method known for this purpose is referred to as lithography, in which a substrate is exposed to a lithographic beam, for instance a particle beam, such as an ion beam or an electron beam. Such a beam can be very small in cross-section. When such a lithographic beam falls on the surface of the substrate, a point of exposure is formed, whose area essentially corresponds to the cross-section of the lithographic beam.

This type of lithography can be used for making a relief pattern for a stamp for imprint lithography, which is described in more detail, for instance, in WO01/42858A1 and WO01/69317, which are incorporated herewith by reference.

This technology may become interesting in the manufacture of the new generation hard disks, where the surface is provided with a structure for high storage capacity. In order to increase the storage capacity, it is desirable to decrease the size of the areas to be magnetized. There is, however, a limit to how far it is possible to force the reduction of the areas before an area is affected by neighboring areas to such an extent that storage of data in an area changes data in a neighboring area.

One way of coping with this is to define in advance magnetizable areas in each of the layers, which areas are separated. For instance such magnetizable areas can take the form of concentric rings, hereinafter referred to as "grooves", which are distributed over the surface of a rotatable disk.

When manufacturing relief patterns for imprint lithography of substrates which are to obtain such grooves, it is desirable to provide a stamp in the same format as the intended product, the stamp having a large number of concentric grooves, where each groove has as small radial variations as possible.

A problem in connection with the making of such concentric grooves involves tolerance variations in the groove made by the lithographic beam, which are caused by mechanical slack or play that arises in the equipment used and that is uncontrollable per se and difficult to handle. This problem occurs especially in conjunction with very small structures being made with great accuracy on a relatively large surface. To make such structures, use is preferably made of particle beams, such as electron or ion beams, since electromagnetic radiation, in case of e.g. optical wavelengths or X-ray wavelengths, usually cannot be focused to the same small dimensions.

U.S. Pat. No. 5,621,216 discloses a method of handling position errors at spot boundaries when manufacturing X-ray masks for E-beam lithography. This is done by the electron beam resist being partially exposed during a plurality of exposures, whereby an average exposure is achieved. The technology suggested in U.S. Pat. No. 5,621,216 is, however, only suited for exposure of small surfaces since the electron beam can only be controlled over a very small area.

There is thus a need for a method for making, by means of a lithographic beam, concentric grooves in a surface layer, by which method the influence exerted by mechanical slack or play of the above type is reduced.

SUMMARY OF THE INVENTION

An object of the present invention thus is to provide a method, a device and a computer program product for lithography, by means of which the above problems are wholly or partly eliminated.

This object is wholly or partly achieved by a method according to claim 1, a computer program product according to claim 18 and a device according to claim 19. Embodiments of the invention are evident from the dependent claims and the following description.

According to a first aspect of the present invention, a method is provided for forming, by exposure to a lithographic beam, a groove of a material, exposed to a predetermined degree, in a surface layer of an essentially flat substrate which is rotatable about an axis. The method is characterized in that the lithographic beam and the axis, during rotation of the substrate about the axis, are controlled relative to each other so that part of the groove is subjected to more than one exposure to the lithographic beam, the groove being formed as a sum of said more than one exposure.

The predetermined degree to which the groove is exposed is sufficient to enable subsequent treatment of the surface layer, for example, by developing the surface layer when it is in the form of a resist.

By essentially flat is meant that the substrate is sufficiently flat to be exposed to lithographic processing by the lithographic beam. In the case of a focused beam, the flatness of the substrate and the depth of field of the beam are adapted to each other.

By the sum of said more than one exposure essentially corresponding to said predetermined degree of exposure, the sensitivity to mechanical slack or play decreases, since each exposure contributes to the final groove but to a certain extent. Thus, the influence that a deviation of an individual exposure will have on the final groove decreases.

According to the method, the lithographic beam and the axis may be held at an essentially constant distance from each other while the substrate is rotated several times about the axis, for forming a circular groove which is concentric with the axis. The lithographic beam and the axis can then be controlled relative to each other to form a plurality of grooves which are concentric with the axis, each groove being exposed to essentially said predetermined degree of exposure, independently of the radial distance of the groove to the axis. Thus, a plurality of grooves with the same degree of exposure can be provided. This may take place in various ways.

According to a first variant, the number of exposures to which the groove is subjected may be a function of the radial distance of the groove to the axis. One advantage of this is that it is easy to vary the number of revolutions when exposure takes place. According to a second variant, the intensity of the lithographic beam may be controlled so as to be a function of the radial distance of the groove to the axis. This results in a more accurate exposure, but requires that the intensity of the lithographic beam can be controlled. According to a third variant, an angular speed at which the substrate is rotated may be a function of the radial distance of the groove to the axis. This results in a more accurate exposure and is usable if the intensity of the lithographic beam cannot be controlled.

Furthermore, the groove may be subjected to continuous exposure to the lithographic beam, to form a continuous groove of exposed material, or to intermittent exposure to the lithographic beam, to form a groove consisting of a plurality of portions of exposed material which are wholly or partly separated in the direction of the tangent.

As a further alternative, the lithographic beam and the substrate may be controlled relative to each other to form an essentially spiral groove, at a varying radial distance from the axis. Also in this case the lithographic beam and the substrate may be controlled relative to each other according to that described above for the purpose of forming a plurality of grooves or groove portions with essentially the same degree of exposure.

According a second aspect of the invention, a computer program product comprises instructions which during execution control a device, in which a lithographic beam forms a groove of a material, exposed to a predetermined degree, in a surface layer of an essentially flat substrate rotatable about an axis. The instructions of the computer program product are characterized in that they ensure that the lithographic beam and the axis, during rotation of the substrate about the axis, are controlled relative to each other so that part of the groove is subjected to more than one exposure to the lithographic beam, the groove being formed as a sum of said more than one exposure.

The computer program product can be a memory medium which is suitable for the purpose and on which software and/or control instructions for controlling the lithographic device are stored and which, during execution, performs the method according to the invention. Examples of such storage media are diskettes, CD-ROMs, DVD-ROMs, hard disks etc. It is also conceivable to distribute the instructions via a computer network, such as the Internet.

According to a third aspect of the invention, a device for lithography comprises a radiation source for generating a lithographic beam, a rotating means for supporting an essentially flat substrate rotatable on said rotating means, a positioning means for moving the lithographic beam and the substrate relative to each other, and a control means for controlling said lithographic beam, rotating means and positioning means. The device is characterized in that said control means, during rotation of the substrate on the rotating means, controls the lithographic beam and the rotating means relative to each other, so that part of the groove is subjected to more than one exposure to the lithographic beam, the groove being formed as a sum of said more than one exposure.

In the device according to the invention, said radiation source may be a particle source, preferably an ion source or an electron source. Alternatively, an electromagnetic source, such as an X-ray source or a light source, may be used, although the radiation from this type of sources usually cannot be focused just as well as particle radiation. By light source is meant, for instance, a point light source which is reproduced on the surface layer or a laser whose light is focused on the surface layer. However, it is not until the resolution which is rendered possible by particle sources that the invention has its main application.

The rotating means may be a device, on which the substrate is arranged to be rotated about a rotational axis with sufficient accuracy and at a sufficient speed. The positioning means may be a device for moving the lithographic beam relative to the substrate. For example, the radiation source or the substrate may be displaced, or the beam may be controlled in prior-art manner by, for instance, deflection. The control means may be, for example, a prior-art numerical control system for generating signals to the positioning means and, optionally, also to the rotating means and/or the radiation source.

It goes without saying that the various features described above may also be combined in the same embodiment.

BRIEF DESCRIPTION OF THE DRAWINGS

Embodiments of the invention will now be described in more detail by way of non-limiting embodiments and with reference to the accompanying drawings.

DESCRIPTION OF EMBODIMENTS OF THE INVENTION

Figure 1:
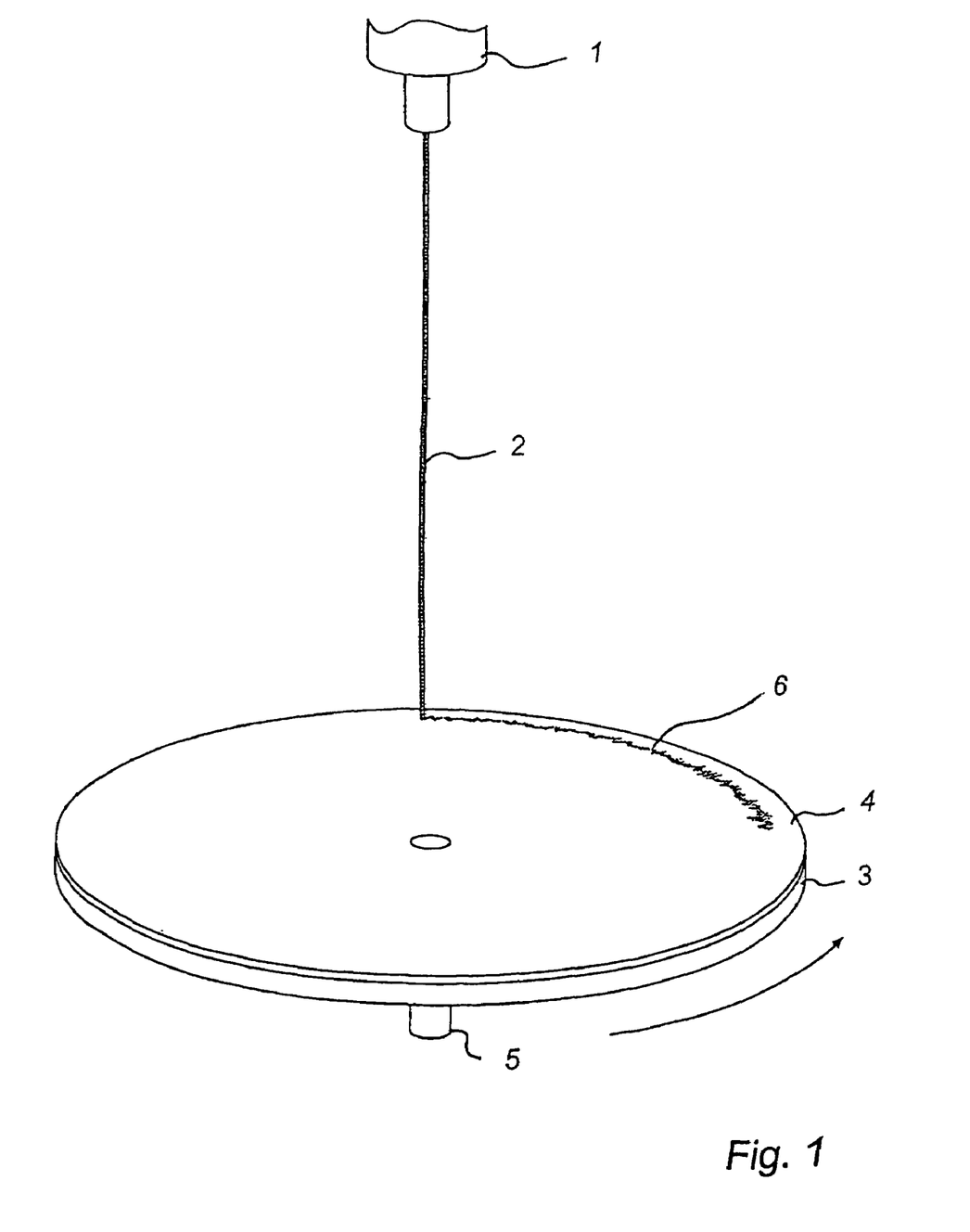
FIG. 1 is a schematic perspective view of a first system with which the present invention can be implemented.

Reference is made to FIG. 1, which shows a system for forming essentially circular grooves in a surface layer of a rotatable medium, such as an optical or magnetic memory medium, or a template/stamp for making such memory media. In the system shown in FIG. 1, an essentially flat substrate 3 is rotatably arranged about an axis 5. A surface layer 4 arranged on the substrate 3 may be essentially flat, i.e. sufficiently flat to be subjected to lithographic processing by means of a lithographic beam 2, for the purpose of making a groove 6 on the layer 3. The lithographic beam 2 may be emitted from a radiation source 1 and be an electron beam or ion beam. Other types of particle beams which are suited for lithography are also conceivable. Alternatively, an electromagnetic radiation source, for instance an X-ray source or a light source, may be used, even if the radiation from this type of sources usually cannot be focused just as well as particle radiation. By light source is meant, for instance, a point light source which is reproduced on the surface layer or a laser whose light is focused on the surface layer. The surface layer 4 can be made of a material suitable for lithography, such as a positive or negative resist. It will also be appreciated that the substrate 3 can be provided with a plurality of wholly or partly overlapping surface layers, one of them having such properties as to be influenced by the lithographic beam 2. Thus it is not only the outermost surface layer that can be processed according to the method, given that exterior layers let through the lithographic beam so that it can be absorbed by the layer which is capable of being influenced. Typically the lithographic beam 2 falls on the surface layer of the substrate on a small spot only, whose cross-section essentially corresponds to the cross-section of the lithographic beam 2.

The radiation source 1 and the substrate 3 are arranged in such a manner that the lithographic beam incident on the surface layer 4 of the substrate can be displaced in at least one direction across the surface layer 4 of the substrate. This may take place, for instance, by the radiation source or the substrate being displaced so that the lithographic beam incident on the surface layer 4 is moved along a radius on the rotatable substrate 3. The displacement of the lithographic beam can take place in a suitable prior-art manner by, for instance, physical movement of the radiation source 1, by physical displacement of the substrate 3, or by a combination thereof. The substrate 3 can be suspended from the axis 5 by means of a rotation bearing suitable for the pose, such as a high precision rotation bearing (not shown), and be provided with a drive mechanism (not shown).

The system in FIG. 1 functions in such a manner that the surface layer 4 of the substrate in one spot is exposed to the lithographic beam 2 while the substrate is rotated about the axis 5. If the lithographic beam 2 is held at a constant distance from the center of rotation, a groove 6, concentric with the rotational axis, of exposed material will be formed in the surface layer 4 of the substrate.

In lithography, the surface layer 4 must be exposed to a predetermined degree to allow the pattern to be developed. Development is performed by dissolving the exposed or unexposed parts of the surface layer, depending on whether the surface layer consists of a positive or negative resist. Then some type of aftertreatment, such as depositing a further layer or etching, may be carried out. Optionally, depositing may be carried out before developing, thereby producing hollow structures. The predetermined degree of exposure is, according to the invention, such that the desired aftertreatment of the surface layer 4 can take place.

As described above, the groove 6 is formed by the surface layer 4 where the groove is desired is repeatedly exposed to the lithographic beam 2, each exposure giving a degree of exposure which is smaller than the predetermined degree of exposure which is necessary for the forming of the desired groove. In the embodiment shown in FIG. 1, this repeated exposure can be performed by the substrate 3 being rotated several turns about the axis 5 while at the same time the lithographic beam 2 is held at a constant distance from the center of rotation. Thus, for instance the influence exerted by any slack or play associated with the mechanical suspension and rotation mechanism (not shown) can be reduced.

As an example, it is possible to select to perform, instead of one exposure, 10 exposures, i.e. rotate the substrate 10 times, the lithographic beam 2 being held in a fixed position. If the predetermined degree of exposure is Q, it is thus possible to expose the area 10 times at a degree of exposure which is Q/10. Thus, the deviation of each exposure will only contribute 10% to the total deviation while the "average area" of the exposures obtains essentially complete exposure corresponding to the predetermined degree of exposure. According to a further example, 100 exposures at a degree of exposure Q/100 are selected, where the deviation of each exposure contributes 1% to the total deviation. It will be appreciated that other numbers of exposures may be chosen and that the intensity of the lithographic beam may be varied within an exposure sequence.

With a view to obtaining the same degree of exposure at the outer grooves on a rotatable substrate 3 as at the inner grooves, some control strategies will now be described.

According to a first control strategy, the number of exposures to which the groove is subjected may be a function of the radius of the groove.

According to a second control strategy, the intensity of the lithographic beam may be controlled so as to be a function of the radius of the groove.

According to a third control strategy, an angular speed at which the lithographic beam and the surface layer are controlled relative to each other may be a function of the radial distance of the groove to the axis 5.

These three control strategies may be combined to achieve an optimal control for the respective applications.

Figure 2:
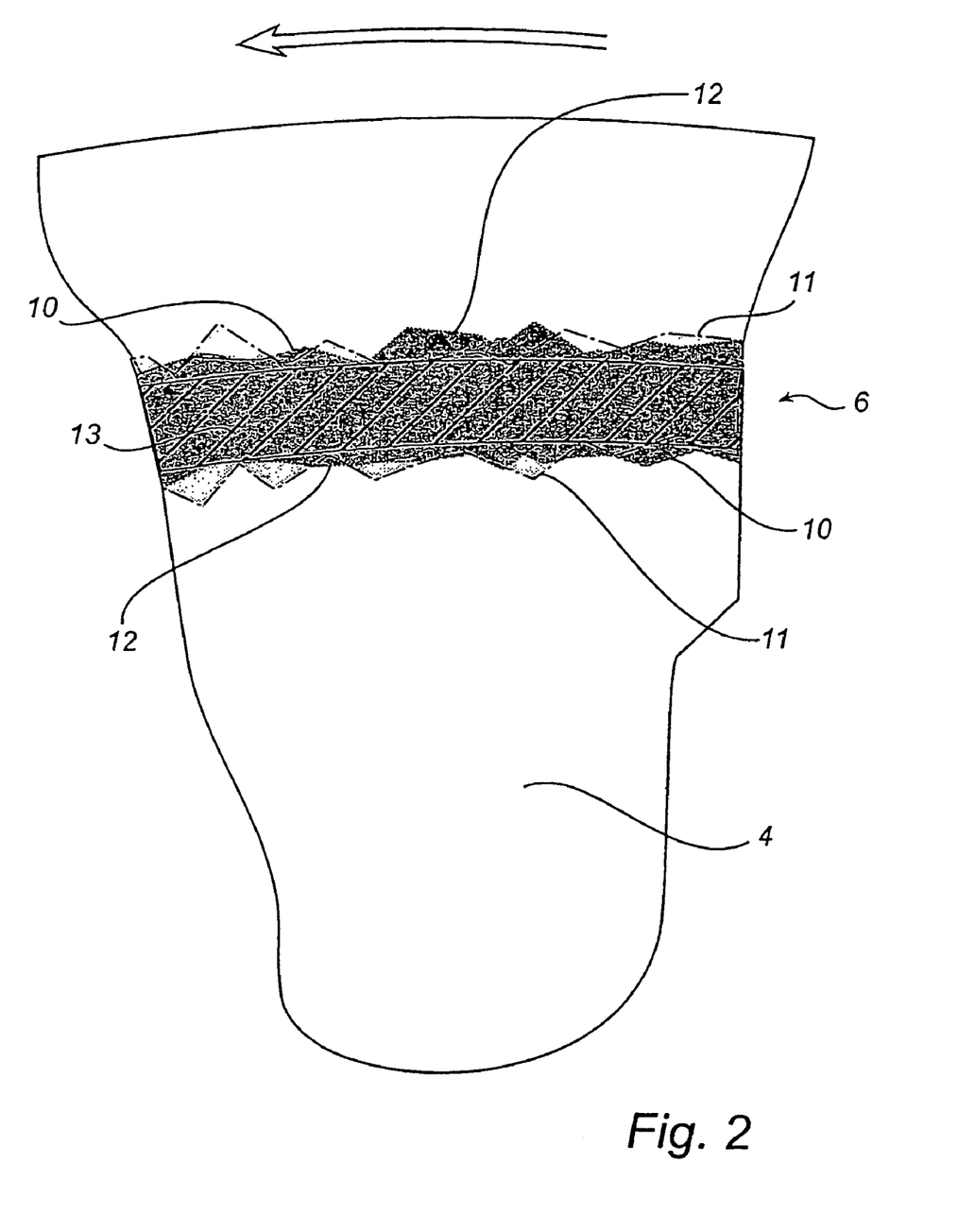
FIG. 2 is a more detailed schematic top plan view of a substrate which can be obtained according to the present invention.

FIG. 2 is a more detailed schematic top plan view of a substrate which can be obtained according to the present invention. FIG. 2 shows specifically a groove 6 of exposed material, which has been formed by the lithographic beam 2 being moved relative to the substrate 3 on three occasions, so that three grooves 10, 11 and 12 of exposed material are formed. As is evident, each of the three grooves 10, 11 and 12 deviates from the desirable groove 13. This deviation may be a result of, for instance, play in the rotation bearing or interference in the lithographic beam caused by ambient static electricity, magnetic fields or electric fields. As appears from FIG. 2, the contribution from the deviation of each exposure however is smaller than in the case where only one exposure had been made, and therefore a groove 6 is obtained in the form of a sum of the three grooves 10, 11 and 12, which sum better approximates the desirable groove 13.

Figure 3:
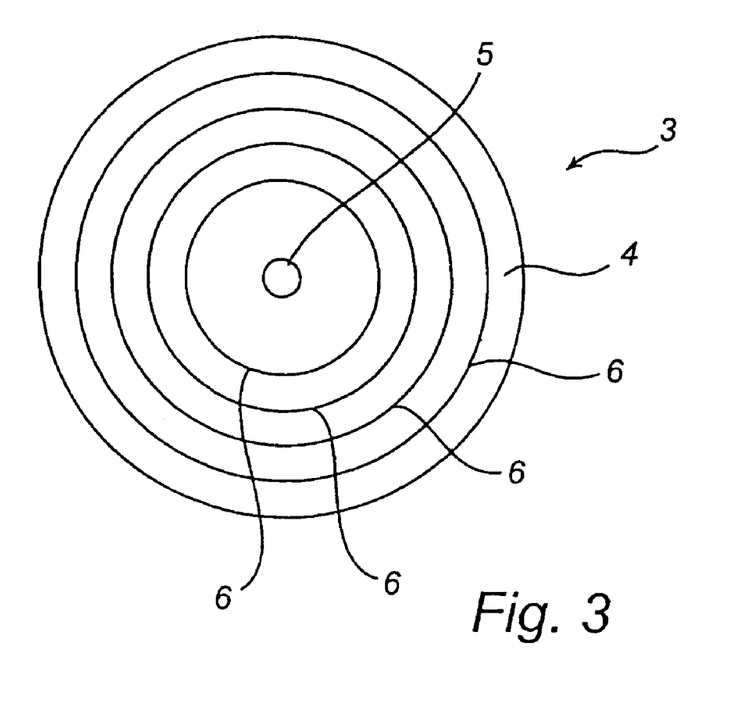
FIG. 3 is a schematic top plan view of a first variant of a substrate according to the present invention.

FIG. 3 is a schematic top plan of a first variant of a substrate according to the present invention. In this variant, a plurality of continuous grooves 6, which are concentric with the rotational axis of the substrate 3, have been formed in the surface layer 4 of the substrate according to one of the methods described above.

Figure 4:
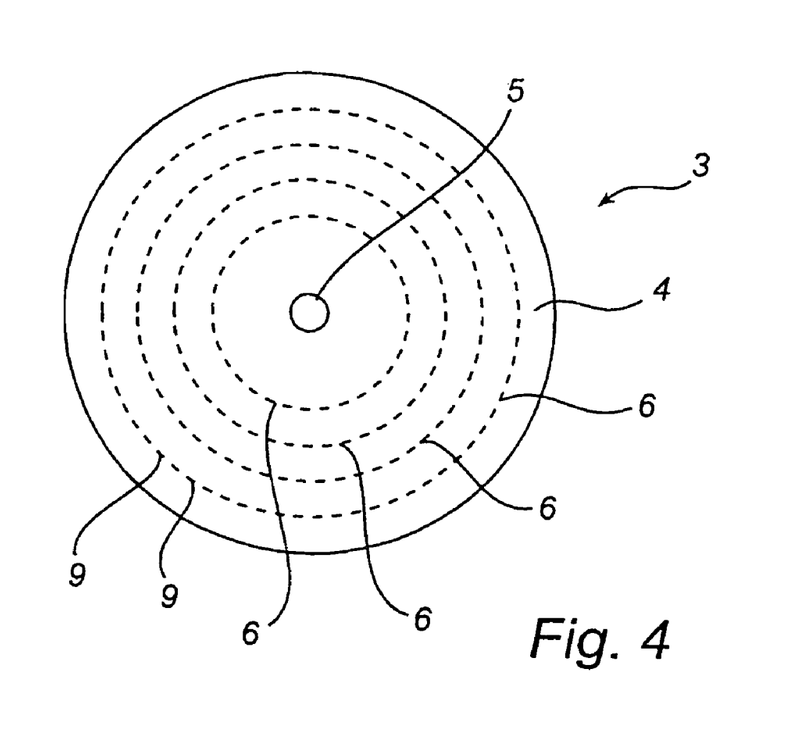
FIG. 4 is a schematic top plan view of a second variant of a substrate according to the present invention.

FIG. 4 is a schematic top plan view of a second variant of a substrate according to the present invention. In this variant, a plurality of non-continuous grooves 6, which are concentric with the rotational axis of the substrate (3), are formed in the surface layer 4 of the substrate according to one of the methods described above. The grooves 6 consist of a plurality of portions of exposed material which are wholly or partly separated in the direction of the tangent. These non-continuous grooves may be formed by being exposed intermittently, i.e. by the lithographic beam 2 being caused to fall on the surface layer in the form of pulses. This can be provided by the actual lithographic beam being pulsed or by a constant lithographic beam passing through a radiation valve.

Figure 5:
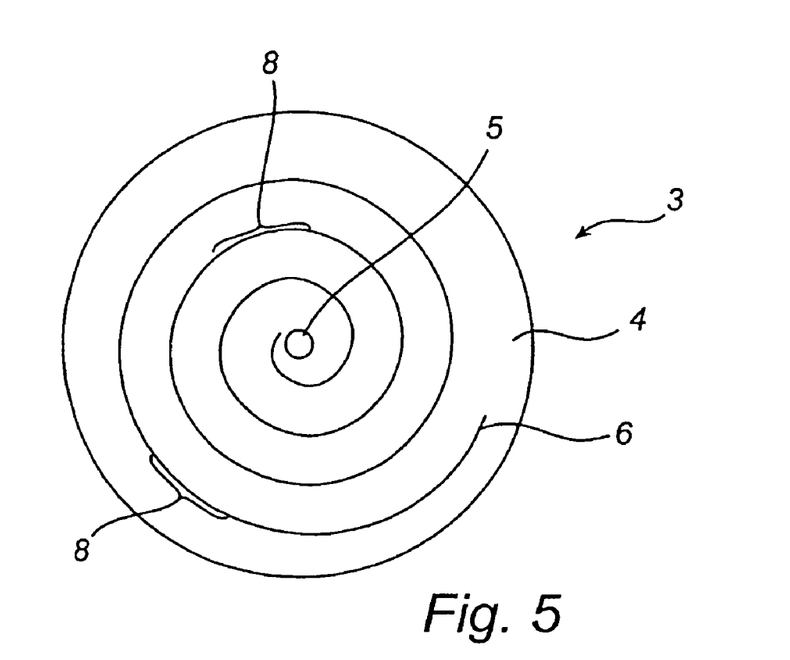
FIG. 5 is a schematic top plan view of a third variant of a substrate according to the present invention.

FIG. 5 is a schematic top plan view of a third variant of a substrate according to the present invention. In this variant a spiral, continuous groove 6 is formed in the surface layer 4 of the substrate according to one of the methods described above. This spiral groove can be formed by the surface layer 4 of the substrate being repeatedly exposed to the lithographic beam while the lithographic beam is displaced radially relative to the substrate 3, as illustrated in FIG. 1. Alternatively, the groove may be formed by deflection, as shown in FIG. 4. It will be appreciated that a plurality of spiral grooves can be formed on the surface layer of the substrate.

Figure 6:
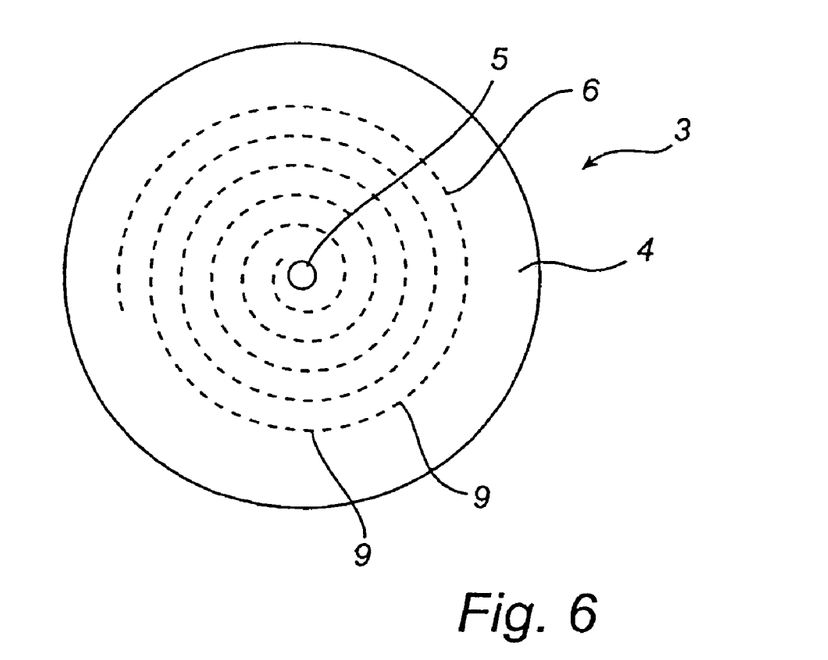
FIG. 6 is a schematic top plan view of a fourth variant of a substrate according to the present invention.

FIG. 6 is a schematic top plan view of a fourth variant of a substrate according to the present invention. In this variant, a spiral, non-continuous groove 6 is formed in the surface layer 4 of the substrate according to one of the methods described above. These grooves consist of a plurality of portions of exposed material which are wholly or partly separated in the direction of the tangent.

Figure 7:
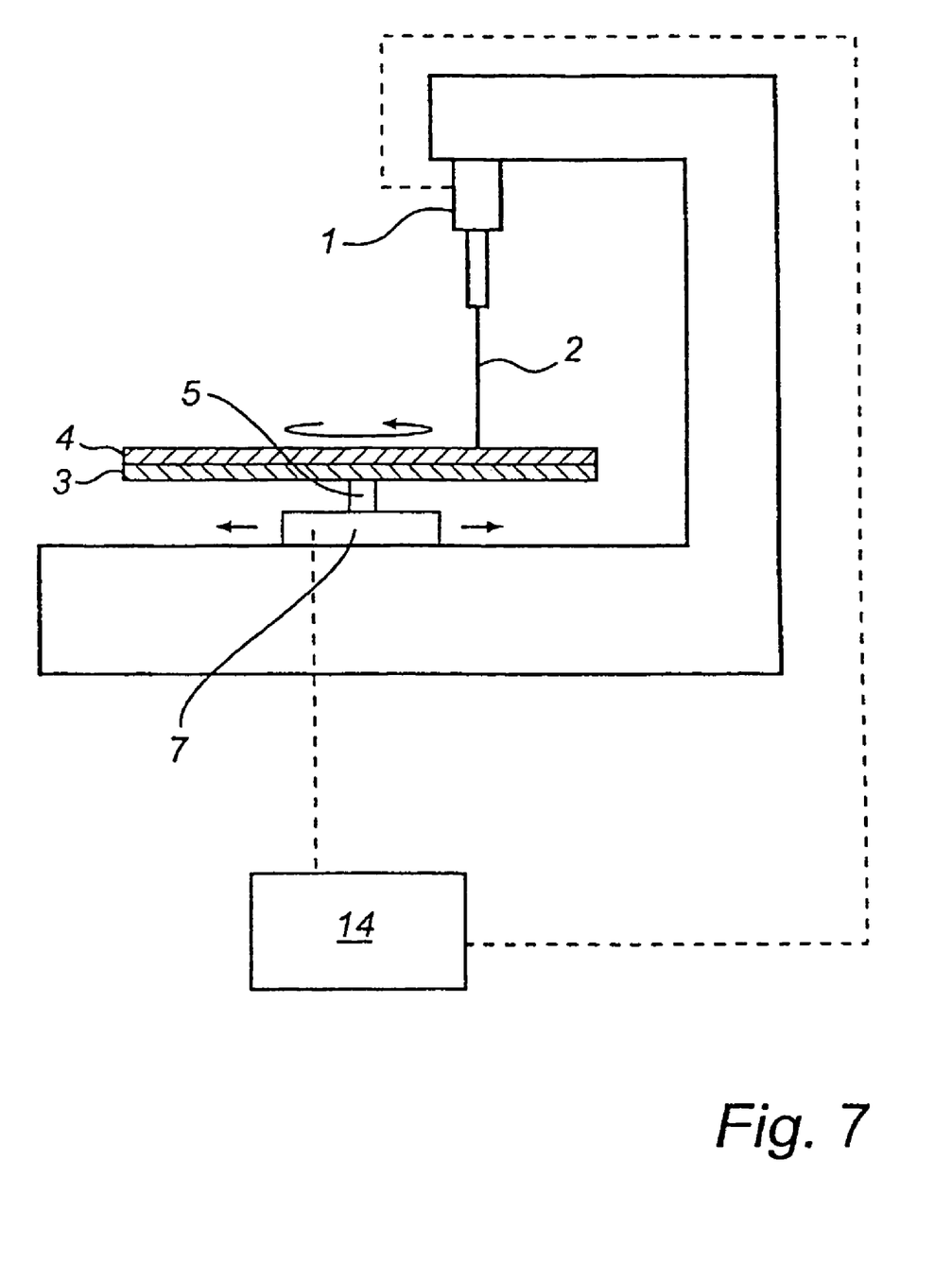
FIG. 7 is a schematic cross-sectional view of a device for lithography, by means of which the present invention can be implemented.

FIG. 7 is a schematic cross-sectional view of a device for lithography, by means of which the present invention can be implemented.

The device comprises a radiation source 1 of a desirable type, for instance a particle radiation source such as an ion source or an electron source, and the components that are required to produce a lithographic beam 2 which is suitable for the purpose. Alternatively an electromagnetic radiation source, such as an X-ray source or a light source, may be used even if the radiation from this type of sources normally cannot be focused just as well as particle radiation. By light source is meant, for instance, a point light source which is reproduced on the surface layer or a laser whose light is focused on the surface layer.

Moreover, the device has a means 5 for rotationally supporting a substrate 3 with a surface layer 4 which is intended to be exposed to the lithographic beam 2. The rotating means 5 is to be arranged so as to be able to cause the substrate 3 to rotate with a minimum slack or play and at a well controllable speed. According to one embodiment, the rotating means has a rotatable body on which the substrate is arranged and is optionally fixed during the treatment. The rotating means 5 can be provided with an antifriction bearing suitable for the purpose and a drive mechanism for driving the rotation of the rotating means 5.

Furthermore the device comprises a positioning means 7 for positioning the radiation source 1 relative to the substrate 3. The positioning means 7 can be configured in various ways. For instance, as shown in FIG. 7, it may comprise a carriage 7 which is displaceable along a radius of the substrate, the radiation source 1 being fixedly arranged and the substrate 3 being displaced relative to the radiation source. Alternatively the radiation source can be displaceable or rotatable and the rotating means 5 supporting the substrate can be fixedly arranged. As a further alternative, the lithographic beam can be deflectable by means of a suitable field, such as a magnetic field or electric field (not shown). Combinations of the above-mentioned different types of positioning means are also feasible.

Moreover the device comprises a control means 14 which may be a control unit suitable for the purpose. For instance a microcomputer (not shown) connected to suitable control loops (not shown) may be used for controlling one or more of the radiation source 1, the rotating means 5 and the positioning means 7.

The control means may be provided with instructions controlling the device according to the method described above.

The inventive method may also be implemented by means of a computer program product for controlling a lithography device. Such a computer program product may contain instructions by means of which the lithography device is controlled according to one of the methods above.

The invention claimed is:

1. A method for forming an optical or magnetic memory medium or a template for making such memory media, comprising the steps of:
    suspending an essentially flat substrate rotatably about an axis, which substrate is provided with a surface layer of a resist material;
    arranging a particle beam source to expose the surface layer to a beam;
    rotating the substrate such that the particle beam forms a groove in the surface layer by exposure to a predetermined degree, which groove has a width on the order of 1-100 nm; and
    controlling the position of the particle beam and the axis relative to each other during rotation of the substrate about the axis, so that the particle beam and the axis are held at an essentially constant distance from each other while the substrate is rotated several times about the axis, and so that at least a part of the groove is subjected to more than one exposure to the particle beam, thereby forming a circular groove which is concentric with the axis and which is formed as a sum of said more than one exposure, which sum corresponds to said predetermined degree of exposure,
    wherein the particle beam and the axis are controlled relative to each other to form a plurality of grooves which are concentric with the axis, each groove being exposed to essentially said pretermined degree of exposure, independently of radial distance of the groove to the axis, and
    wherein the particle beam has an intensity which is controlled so as to be a function of radial distance of the groove to the axis.

2. The method as claimed in claim 1, wherein the number of exposures to which the groove is exposed is a function of radial distance of the groove to the axis.

3. The method as claimed in claim 2, wherein the substrate is rotated with an angular speed which is a function of radial distance of the groove to the axis.

4. The method as claimed in claim 1, wherein the particle beam and the substrate are controlled relative to each other to form an essentially spiral groove at a varying radial distance from the axis.

5. The method as claimed in claim 4, wherein the groove is formed as a plurality of groove portions, each groove portion being exposed to essentially said predetermined degree of exposure, independently of radial distance of the groove portion to the axis.

6. The method as claimed in claim 5, wherein a number of exposures to which the groove portion is exposed is a function of radial distance of the groove portion to the axis.

7. The method as claimed in claim 5 or 6, wherein the particle beam has an intensity which is controlled so as to he a function of radial distance of the groove portion to the axis.

8. The method as claimed in claim 5, wherein the substrate is rotated at an angular speed which is a function of radial distance of the groove portion to the axis.

9. The method as claimed in claim 1, wherein the groove is subjected to continuous exposure to the particle beam, to form a continuous groove of exposed material.

10. The method as claimed in claim 1, wherein the groove is subjected to intermittent exposure to the particle beam, to form a groove consisting of a plurality of portions of exposed material, which are wholly or partly separated in the direction of the tangent.

11. The method as claimed in claim 1, wherein the substrate is rotated about a rotational axis perpendicular to said surface layer.

12. The method as claimed in claim 1, wherein the particle beam is an ion beam or an electron beam.

13. A device for forming an optical or magnetic memory medium or a template for making such memory media, having a circular groove with a width on the order of 1-100 nm, comprising:
    a particle radiation source for generating a particle beam;
    rotating means for supporting an essentially flat substrate rotatable about an axis on said rotating means;

positioning means for moving the particle beam and the substrate relative to each other; and a control means for controlling said particle beam, rotating means, axis, and positioning means relative to each other, wherein said control means, during rotation of the substrate on the rotating means, controls the particle beam and the rotating means relative to each other, so that the particle beam and the axis are held at an essentially constant distance from each other, the groove is held concentric with the axis, and at least a part of the groove is subjected to more than one exposure to the particle beam, the groove being formed as a sum of said more than one exposure, which sum corresponds to a predetermined degree of exposure, wherein the particle beam and the axis are controlled relative to each other to form a plurality of grooves which are concentric with the axis, each groove being exposed to essentially said predetermined degree of exposure, independently of radial distance of the groove to the axis, and wherein the particle beam has an intensity which is controlled so as to be a function of radial distance of the groove to the axis.

14. The device as claimed in claim 13, wherein said radiation source is an ion source or an electron source.

* * * * *